United States Patent [19]

Vail, III

[11] Patent Number: 4,528,508
[45] Date of Patent: Jul. 9, 1985

[54] NUCLEAR MAGNETIC RESONANCE METHOD AND APPARATUS FOR REMOTE DETECTION AND VOLUMETRIC MEASUREMENT OF PETROLEUM RESERVES

[75] Inventor: William B. Vail, III, Bothell, Wash.

[73] Assignee: ParaMagnetic Logging, Inc., Bothell, Wash.

[21] Appl. No.: 387,198

[22] Filed: Jun. 10, 1982

[51] Int. Cl.³ .............................................. G01R 33/08
[52] U.S. Cl. ..................................... 324/303; 324/300
[58] Field of Search ............... 324/300, 301, 303, 309, 324/304

[56] References Cited

U.S. PATENT DOCUMENTS 3,360,717 12/1967 Bloom et al. ...................... 324/303

Primary Examiner—Michael J. Tokar
Attorney, Agent, or Firm—Flehr, Hohbach, Test, Albritton & Herbert

[57] ABSTRACT

A new method and apparatus is described which allows remote sensing and in-situ volumetric measurement of liquid petroleum reserves. A small fraction of the nuclear magnetic moments of protons in a liquid oil reserve align in the earth's magnetic field. This nuclear paramagnetism slightly alters the strength of the earth's static magnetic field above the oil reservoir. The size of the paramagnetic contribution to the earth's magnetic field is proportional to the volume of the petroleum reserve. An artificial A.C. magnetic field is applied to the bulk oil reserve at the Larmor frequency. This A.C. magnetic field causes the condition appropriate for nuclear magnetic resonance which under certain circumstances, causes the paramagnetic contribution to the earth's magnetic field to vanish. Different phenomena causing this paramagnetic contribution to vanish include saturation effects and the conditions described by rapid passage.

Under these circumstances, frequency sweeping the A.C. magnetic field through magnetic resonance while simultaneously measuring the variation earth's magnetic field yields a direct measure of the total volume of the oil reserve. Numerous means are utilized to produce the appropriate A.C. magnetic field including simply passing an A.C. current through the oil formation between two boreholes. In this case, a sensitive induction magnetometer senses the change in the earth's magnetic field as the A.C. current is frequency swept through resonance. Methods are disclosed which also allow the determination of some characteristic dimensions of the oil deposit. Appropriate measurement of the relaxation of the earth's magnetic field after passage through resonance yields the oil/water ratio under certain circumstances.

31 Claims, 6 Drawing Figures

NUCLEAR MAGNETIC RESONANCE METHOD AND APPARATUS FOR REMOTE DETECTION AND VOLUMETRIC MEASUREMENT OF PETROLEUM RESERVES

This invention relates to a new nuclear magnetic resonance method and apparatus which remotely senses and measures the fluid volume of petroleum reservoirs.

Nuclear paramagnetism was first measured at very low temperatures on solid hydrogen (B. G. Lasarew and L. W. Schubnikow, Phys. Z. Sowjet, 11, p. 445, 1937). In this experiment the sample's paramagnetism was observed during temperature cycling. However, for ordinary sized laboratory samples at room temperature, nuclear paramagnetism becomes extraordinarily feeble and difficult to measure. Consequently, many other experimental techniques known collectively as nuclear magnetic resonance techniques were developed to observe the nuclear magnetic moments of nucleons in solids and liquids.

Nuclear magnetic resonance measurements are classified into "continuous wave" and "pulse" methods. Continuous wave observations of nuclear magnetic resonance are performed using power absorbtion measurements or nuclear induction arrangements (E. R. Andrew, *Nuclear Magnetic Resonance*, Cambridge Univ. Press, N.Y., p. 34, 1955). Pulse methods, also known as free precession techniques, have been developed in recent years (T. C. Farrar and E. D. Becker, *Pulse and Fourier Transform NMR*, Academic Press, N.Y., p. 1, 1971).

Common to all these nuclear magnetic resonance techniques are various means used to apply an A.C. magnetic field at the Larmor frequency to the collection of magnetic moments in a sample. All of these techniques rely on initially producing a coherent magnetization of the sample which moves dynamically in time and which eventually decays due to relaxation phenomena. This initially coherent magnetization executes complex motion away from the axis of the original static magnetic field. Furthermore, this type of time varying coherent magnetization produces large observable effects in a laboratory environment such as significant induced A.C. voltages in pick-up coils. The measurement of the presence of this coherent magnetization is, of course, an indication that the sample is in the condition of resonance.

It is well known that a single nuclear magnetic moment executes a precessional motion around a static magnetic field. In the normal ½ gauss earth's magnetic field, the proton's magnetic moment precesses at a Larmor frequency of approximately 2.1 kilohertz. The tip of the magnetic moment vector traces out a cone shaped motion around the static magnetic field. If a large number of magnetic moments are placed in the earth's magnetic field, similar motion ensues except that the tips of the magnetic vectors fan out around the same cone. The fact that some of the nuclear magnetic moments have components along the direction of the magnetic field causes the sample's paramagnetism.

A microscopic description of the fluid in formation provides the reason why these fluids exhibit the phenomenon of paramagnetism. Nucleons which are chemically bound in hydrocarbons and water possess magnetic moments. These moments tend to line up in the earth's magnetic field. Consequently, the earth's magnetic field in the vicinity of the hydrocarbons and water in formation is increased by their presence. This alteration of the strength of the magnetic field of the earth in the vicinity of fluids in the formation is the phenomenon of paramagnetism. Conversely, if this alignment of nucleons in the earth's magnetic field is caused to disappear by any mechanism, then the paramagnetism of the formation would disappear and the magnetic field adjacent the formation would change.

Heretofore, it has been noticed theoretically that as the conditions for nuclear magnetic resonance are reached, the original paramagnetism of the sample is reduced or eliminated (T. C. Farrar and E. D. Becker, op. cit., p. 14). However, this fact has not been used experimentally to actually measure whether the sample has attained the conditions of resonance. Consequently, a new nuclear magnetic resonance method is proposed whereby the condition of resonance is measured by the reduction or disappearance of the original paramagnetism of the sample. Furthermore, it is proposed to use this new type of nuclear magnetic resonance method to detect the presence of unknown petroleum reservoirs in geological formations and also allow the direct measurement of significant portions of oil and water fluid volume contained within the formation. It is to be emphasized that the practicality of the method is directly attributed to the enormous volume of liquid contained in a petroleum reservoir.

There have been prior attempts to utilize standard nuclear magnetic resonance techniques in-situ and on entire bulk petroleum reservoirs. In U.S. Pat. No. 3,019,383 (1962), Russell H. Varian proposes using a pulse type free precession nuclear magnetic resonance technique to indicate the presence of oil. In U.S. Pat. No. 3,060,371, Jonathan Townsend (1962) proposes performing resonance experiments on unpaired electronic moments to locate petroleum reservoirs. In U.S. Pat. No. 3,398,355, a pulse type nuclear magnetic resonance experiment is proposed to be flown in aircraft to locate oil deposits. All of these methods rely on the coherent precession of magnetization after conditions appropriate for resonance have been obtained. Furthermore, all of these methods require relatively large magnetic fields and are consequently impractical.

Other techniques have been proposed to remotely sense bulk oil deposits by monitoring the absorbtion of radiation at the Larmor frequency. Examples of these methods are given in U.S. Pat. No. 3,411,070 (1968) and in U.S. Pat. No. 3,437,914 (1969). Here again, numerous theoretical and experimental flaws make these methods impractical.

Standard nuclear magnetic resonance methods are currently being used to measure the properties of oil reservoirs immediately adjacent to boreholes. See for example U.S. Pat. Nos. 4,035,718 (1977); 3,667,035 (1972); 3,657,730 (1972); 3,617,867 (1971); 3,508,438 (1970); 3,483,465 (1969); 3,439,260 (1969); 3,395,337 (1968); etc. The reason that these representative techniques are used immediately adjacent to boreholes is that the standard magnetic resonance methods used heretofore require applying relatively strong magnetic fields. Although these are useful measurements, they do not directly measure the amount of liquid petroleum available over large volumes of oil bearing formation.

Accordingly, an object of the invention is to provide a new and practical nuclear magnetic resonance method for the remote detection and direct volumetric measurement of petroleum reserves.

It is yet another object of the invention to provide new and practical nuclear magnetic resonance apparatus for the remote detection and the direct volumetric measurement of petroleum reservoirs.

Still further, it is another object of the invention to provide new nuclear magnetic resonance methods and apparatus for remote detection and volumetric measurement of petroleum reservoirs which contain chemical constituents with short relaxation times, particularly, those with short transverse relaxation times.

And further, it is still another object of the invention to provide new nuclear magnetic resonance methods and apparatus for the remote detection and volumetric measurement of petroleum reservoirs which also measure characteristic dimensions of the reservoirs.

Figure 3:
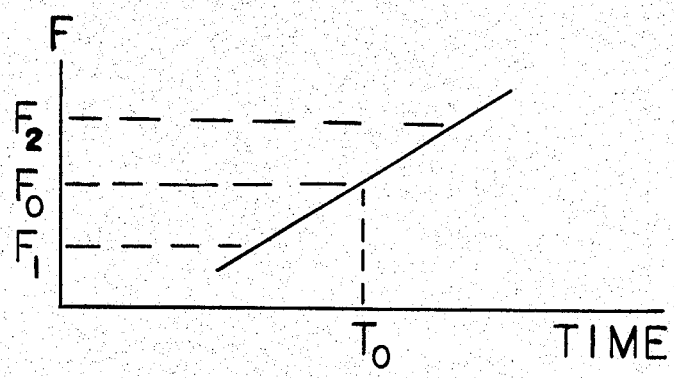

FIG. 3 describes frequency sweeping the A.C. magnetic field applied to the oil bearing formation.

Figure 4:
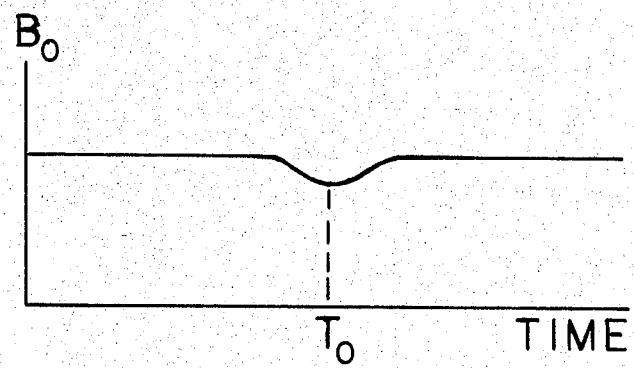

FIG. 4 shows the decrease in the magnetic field of the earth as the oil bearing formation is swept through nuclear magnetic resonance.

Figure 5:
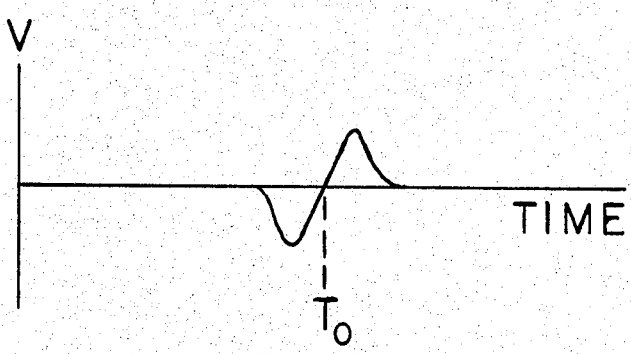

FIG. 5 shows the voltage induced in the induction magnetometer due to the variation in the earth's magnetic field as the oil bearing formation is swept through resonance.

Figure 6:
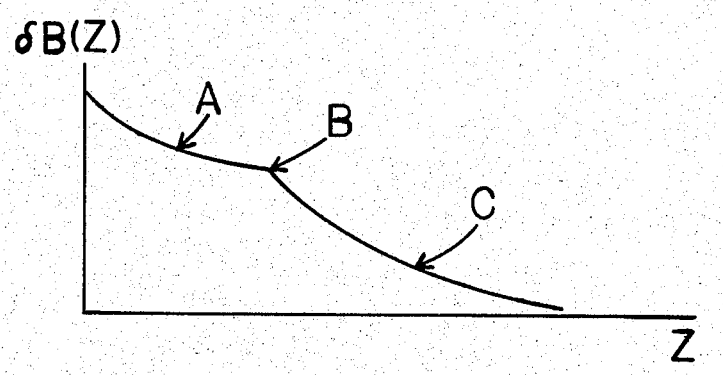

FIG. 6 describes the magnetic field variations for different distances above the oil bearing formation.

Figure 1:
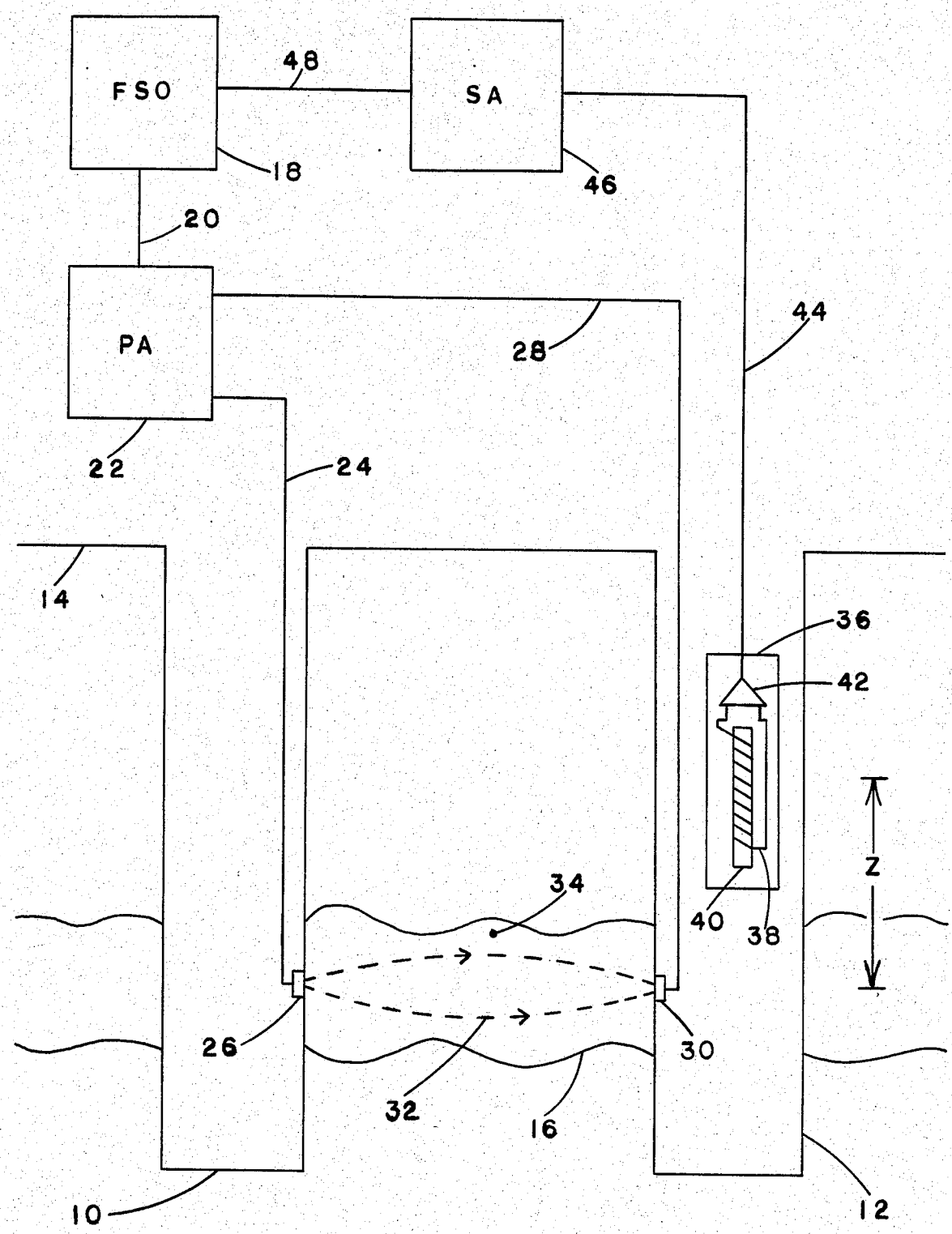
FIG. 1 is a section view of one perferred embodiment of the invention for the remote detection and direct volumetric measurement of petroleum reservoirs.

FIG. 1 shows a perferred embodiment of the apparatus for remote sensing and volumetric measurement of petroleum reserves. This particular embodiment is appropriate when drilling has already occurred in the oil field. Two boreholes, 10 and 12 respectively have been drilled from the earth's surface 14. As is shown, the boreholes have drilled through the oil bearing formation 16. A standard frequency sweep oscillator 18 has an output 20 which drives an A.C. power amplifier 22. This frequency sweep oscillator (F.S.O.) must be capable of slowly frequency sweeping around approximately 2.1 KHz. and the power amplifier (P.A.) must be capable of providing significant A.C. current near the frequency of 2.1 kilohertz. One output of the power amplifier is attached to a cable 24 which is lowered into borehole 10 and is connected to a means 26 of introducing current into the formation. The other output of the power amplifier is attached to a cable 28 which is lowered into borehole 12 and is connected to a means 30 of introducing current into the formation. Therefore, A.C. current is conducted through the oil bearing formation in paths collectively identified as 32 in FIG. 1. The total A.C. current passing through the oil bearing formation produces an A.C. magnetic field throughout the oil bearing strata. For example, at a location labled 34 within the formation, there exists an A.C. magnetic field whose vector is primarily out of the drawing. The magnitude of the A.C. magnetic field but not the frequency depends on location in the formation. The frequency of 2.1 KHz. is the Larmor frequency of protons in the nominal strength of the earth's magnetic field of ½ gauss. Therefore, a means is provided whereby a significant portion of the oil bearing formation may be subjected to an A.C. magnetic field at the Larmor frequency of protons in the earth's magnetic field. This significant portion of the formation subjected to the condition of nuclear magnetic resonance is also called the "excitation zone" for brevity. Furthermore, a means is provides where by a significant portion of an oil bearing formation may be swept through a condition of nuclear magnetic resonance.

A borehole magnetometer assembly labeled as 36 in FIG. 1 is lowered into borehole 12 a distance Z above the center of the oil bearing formation. In this particular embodiment, the borehole magnetometer assembly includes a large number of turns of insulated wire 38 which are wound around a very high permeability magnetic core material 40 which is in turn connected to an amplifier 42. This amplifier must be stable, have high gain, extremely low noise, narrow bandwidth, and excellent low frequency response. A relatively new integrated circuit which is very well suited for this purpose is the OP-27A/E (Precision Monolithics Inc., 1500 Space Park Dr., Santa Clara, Ca. 95050). This operational amplifier has a very low input noise voltage density of 5 nanovolts per square-root hertz at a frequency of 10 hertz. The required low noise and high gain is obtained using standard electronic design principles and several OP-27A/E integrated circuits. The output of this amplifer is connected to a shielded cable 44 which leaves the borehole and is connected to the input of a standard signal averager 46. The signal averager (S.A.) obtains its reference sync. pulse via a cable 48 which is connected to the sync. pulse output of the frequency swept oscillator. Consequently, a means has been provided which measures the low frequency change, variation, or amplitude modulation, of the earth's magnetic field. Measurements at various positions Z provide a means whereby the amplitude modulation of the earth's magnetic field can be measured in the vicinity of the excitation zone of the formation.

As has been briefly discussed, as matter is swept through the condition of nuclear magnetic resonance, it is expected that the original paramagnetism of a sample should decrease or vanish under certain circumstances. In this embodiment of the invention, a means has been provided to sweep the oil bearing formation through a condition of nuclear magnetic resonance. Therefore, as the formation is swept through resonance, the paramagnetism of the oil formation is decreased or eliminated. The small paramagnetism of the oil formation contributes to the total magnetic field measured by the magnetometer. Consequently, as the oil formation is swept through resonance conditions, a small decrease in the earth's magnetic field in the vicinity of the excitation zone is observed. This decrease in the magnetic field strength is directly related to the volume of liquid petroleum in the excited portion of the formation. As the formation is repetitively swept through resonance, the signal averager is used to increase the signal and decrease the noise using standard signal processing techniques.

It is now necessary to more precisely define the conditions which result in a reduction of the paramagnetism during resonance conditions. To do this, some additional physics must be described. In what follows, it is shown that there are requirements on both the frequency sweep rate and A.C. magnetic field strength which depend on the physical properties of the bulk petroleum reservoir. The following physics is also necessary to demonstrate that the invention provides a practical means of sweeping the oil formation through resonance and furthermore provides a practical means to measure the resulting variation in the earth's magnetic field. It will be understood, however, that the invention is not to be specifically limited by the theory which follows.

Figure 2:
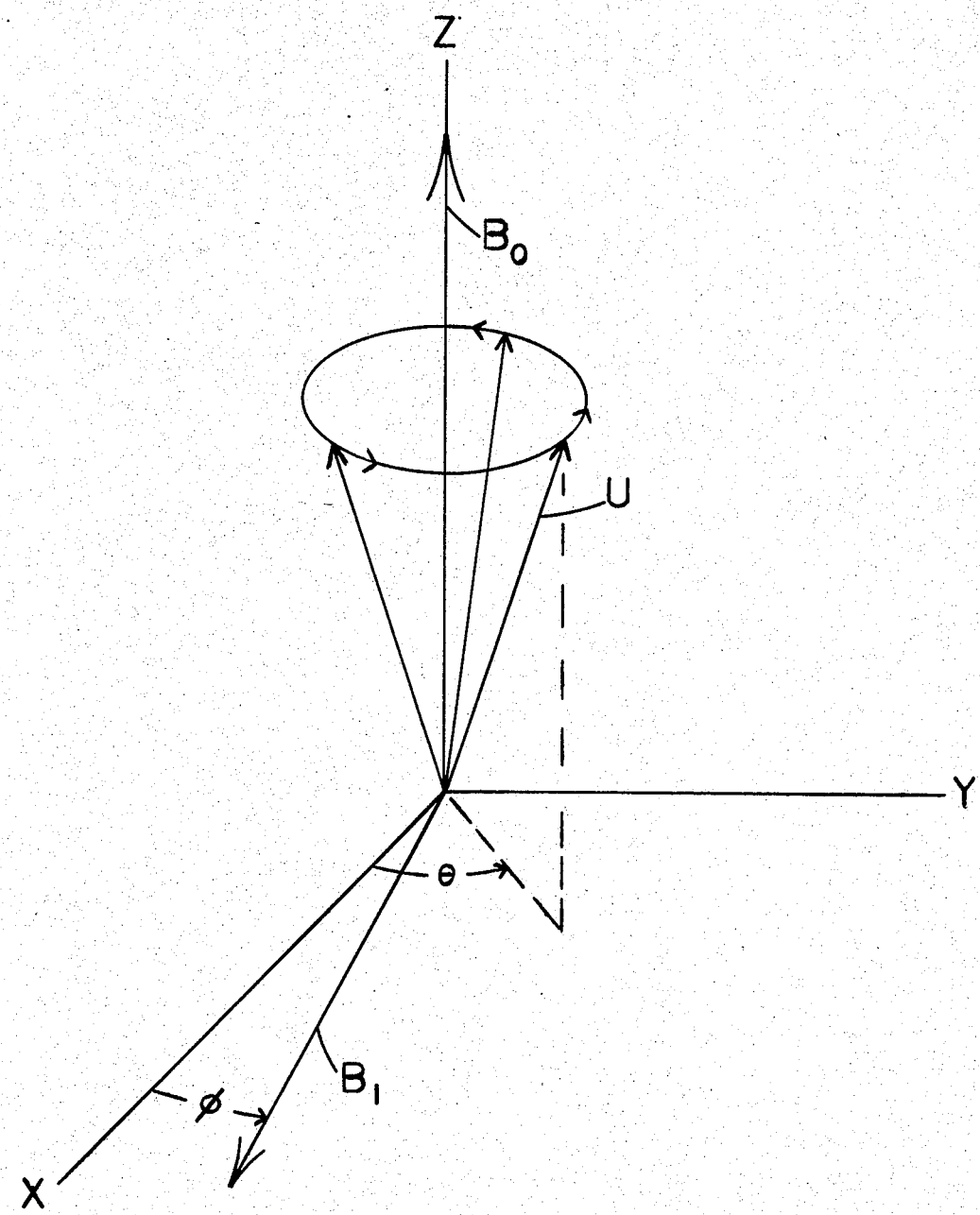
FIG. 2 is a diagram used to describe the motion of magnetic moments in an oil bearing formation during nuclear magnetic resonance conditions.

The motion of a collection of nuclear magnetic moments is described with reference to a coordinate frame as shown in FIG. 2. The magnetic field of the earth is $B_o$ and lies along the Z axis of the coordinate frame. An individual magnetic moment U precesses in a conic motion around the direction of $B_o$ in the absence of other magnetic fields. The magnetic moment executes this type of motion because the time rate of change of the vector angular momentum (dL/dt) must equal the vector torque on the magnetic moment ($U \times B_o$), as shown in Eq. 1.

$$dL/dt = U \times B_o \qquad \text{Equation 1.}$$

This type of motion is described by locating the angular postion of the tip of the magnetic moment U with respect to the X axis in FIG. 2. This angular position is defined by the angle $\theta$ in FIG. 2. The time rate of change of the angle is called the angular precession frequency $w_o$. This angular frequency is related to the earth's magnetic field and to the gyromagnetic ratio of the proton $\gamma$ by the following equation:

$$w_o = \gamma B_o \qquad \text{Equation 2.}$$

As is shown in many elementary physics texts, Equation 2 is a consequence of Equation 1. Of course, the many individual magnetic moments fan out around the cone at different angles $\theta$ as shown in FIG. 2. However, the fact that the many magnetic moments have components along the Z axis produces a net magnetization $M_z$ along the Z direction. This effect of course produces the nuclear paramagnetism of petroleum. An external magnetic field $B_1$ is applied to the precessing magnetic moments as shown in FIG. 2. For simplicity only, $B_1$ is confined to the X—Y plane, has constant magnitude and it rotates in time through the angle 100 which is defined in FIG. 2. In general, $B_1$ must only have a nonparallel component to $B_o$ for the validity of the following analysis ($B_1$ must be at an angle to be $B_o$). Defining the time rate of change of the angle 100 to be the quantity w, it is well known that the condition of magnetic resonance occurs when:

$$w = w_o \qquad \text{Equation 3.}$$

The physical significance of resonance is that energy may be coupled from the $B_1$ field into the precessing magnetic moments thus altering their motion. If the frequency of the applied magnetic field w is swept slowly through resonance, the solution to motion of the vector magnetization of the sample is given by the steady state solution to the "Bloch equations". These equations and their solution under these conditions are given in E. R. Andrew, op. cit., page 28.

In this analysis it is shown that the paramagnetism of the sample may be reduced significantly or eliminated at resonance. This phenomenon is called "saturation". In this condition, the magnetization in the Z direction, $M_z$ is reduced or eliminated. In the aforementioned reference it is shown that saturation occurs if the following mathematical condition is obeyed:

$$\gamma^2 B_1^2 T_1 T_2 \geq 1 \qquad \text{Equation 4.}$$

In this equation, $\gamma$ and $B_1$ have already been defined. The quantity $T_1$ is the longitudinal relaxation time and $T_2$ is the transverse relaxation time. These relaxation times are of importance and the physical significance that these times have upon the motion of the collection of magnetic moments is well described in T. C Farrar and E. D. Becker, op. cit., pages 7-15. Briefly, in this case $T_1$ is the time it takes for the disoriented magnetic moments to achieve thermal equilibrim and hence realign along the Z axis after the conditions of saturation have been achieved. Therefore, $T_1$ is also called the thermal relaxation time. $T_2$ is the time it takes for a hypothetical group of magnetic moments which have been originally aligned in one single direction in the X—Y plane of FIG. 2 to become disoriented with their vectors fanning out and pointing at random in that X—Y plane. $T_2$ is also known as the spin-spin relaxation time.

If the embodiment in FIG. 1 is to be practical, the magnitude of the magnetic field $B_1$ as specified in Eq. 4 must not be impractically large. Most measurements of the thermal relaxation time $T_1$ of crude oil in formation are known to all within the following range of times (J. D. Robinson, et. al., J. Pet. Tech., 26, p. 226, 1974):

$$0.1 \text{ sec} \leq T_1 \leq 5 \text{ sec} \qquad \text{Equation 5.}$$

In U.S. Pat. No. 3,395,337 R. H. Varian (1968) has measured the following limits on $T_2$:

$$10^{-5} \text{ sec} \leq T_2 \leq 60 \text{ sec} \qquad \text{Equation 6.}$$

In the worst possible case corresponding to the minimum times as specified for $T_1$ and $T_2$, the minimum required strength $B_1$ is approximately 37 milligauss. Consequently, if a magnetic field of 37 milligauss is applied to an oil bearing formation at the Larmor frequency, saturation will occur. Furthermore, it is well known that most transverse relaxation times are longer than $10^{-4}$ sec (see Eq. 6). This therefore would require an A.C. field strength of only 11.7 milligauss. Consequently, it has been shown that there is a minimum A.C. magnetic field strength necessary to produce saturation which is related to the relaxation properties of the oil bearing formation.

Another separate condition for the observation of saturation is that the frequency must be swept "slowly". This is known as "abiabatic passage". In adiabatic passage, the change in the angular sweep rate per unit time (dw/dt) must satisfy the following condition (A. Abragam, *The Principles of Nuclear Magnetism*, Clarendon Press, Oxford, 1961, p 35):

$$dw/dt << \gamma^2 B_1^2 \qquad \text{Equation 7.}$$

This equation shows that if $B_1$ has a magnitude of 11.7 milligauss, the maximum frequency sweep rate is approximately 100 HZ/sec. The maximum sweep rate depends on $B_1$ and this quantity in turn depends on the relaxation properties of the oil formation. Consequently, under the conditions of adiabatic passage, there is a maximum permissible frequency sweep rate applicable to a given oil bearing formation.

If the above sweep rate is exceded, other phenomena happen which are classified as types of "fast passage". In these cases, the magnetization of the sample cannot follow the net magnetic field and neon of the conditions applicable to adiabatic passage are satisfied. However, the magnetization in the z direction, $M_z$, does in fact decrease or disappear if the following equation is satisfied (T. C. Farrar, E. D. Becker, op. cit., p. 10-15):

$$1 \leq \gamma B_1 t \leq \gamma B_1 T_1 \qquad \text{Equation 8.}$$

In Eq. 8 the transit time through resonance t must certainly be less than the longitudinal relaxation time $T_1$. From Eq. 5, the minimum logitudinal time is 0.1 sec and therefore Eq. 8 specifies that in this worst case, the minimum magnitude of the required magnetic field is approximately 0.37 milligauss. This is a very small magnetic field. For example, if an A.C. current of 10 amps (peak-to-peak) were passed through a localized area of the petroleum reservoir, the A.C. magnetic field produced by this current would exceed 0.37 gauss (peak-to-peak) inside a radius of 54 meters. Consequently, the invention provides a practical means to sweep significant portions of an oil bearing formation through the condition of magnetic resonance.

The invention provides a practical method of detecting the effects of saturation and fast passage phenomena. The paramagnetism of the oil formation gives rise to a small increase in the magnetic field above the oil reservoir $\delta B(Z)$. For simplicity only, it is assumed that the resonance is due only to "unpaired protons" (also called "hydrogen-like" or "unbound"). Near the reservoir:

$$\delta B(Z=0) = u_o \rho U^2 B_o / 3kT \cong 1 \times 10^{-10} \text{ Gauss} \qquad \text{Equation 9.}$$

The quantities used in this M.K.S. equation include the following: $u_o$ (permeability of space); $\rho$(number of unpaired protons/$M^3$); U (magnetic moment of a proton); $B_o$ (earth's magnetic field); k (Boltzman's constant); and T (absolute temperature).

Ideally, this small magnetic field is driven to zero during a sweep through resonance. The resulting induced voltage in the induction magnetometer shown in FIG. 1 may be estimated. The core labeled as 40 in FIG. 1 is made of permalloy with a 1 $cm^2$ area and a length of 100 cm which therefore has an "effective permeability" of 20,000 (G. V. Keller and F. C. Frischknecht, *Electrical Methods in Geophysical Prospecting*, Pergamon Press, N.Y., p. 237, 1966). The coil has 100,000 turns and the sweep time is approximately one second. Consequently, an induced voltage of 24 nanovolts appears across the induction coil. This is five times larger than the input noise voltage density of the OP-27A/E operational amplifier. Thus, the induced voltage due to the saturation of the oil bearing formation may be easily detected over the noise present in the circuitry.

FIGS. 3, 4, and 5 show the time dependence of the experimental signals expected from the apparatus embodied in FIG. 1. FIG. 3 shows the frequency, F, of the A.C. magnetic field is swept from a lower frequency $F_1$ through the resonant frequency $F_o$ to a higher frequency $F_2$ in a time which must be less than the longitudinal relaxation time of the oil bearing formation. At the time $T_o$, the formation is in the condition of nuclear magnetic resonance. FIG. 4 shows the corresponding decrease in the earth's magnetic field, $B_o$, at the time $T_o$. And the voltage appearing across the induction coil, V, is shown in FIG. 5.

The precise shape of the signal in FIG. 5 depends on the longitudinal and transverse times $T_1$ and $T_2$ among other parameters such as the sweep time, etc. The oil/water ratio may be deduced under certain circumstances as has been done in another experimental situation (J. D. Robinson, et al, op. cit.). Oil and water are separated by periodically sweeping the formation through resonance repetitiously and simultaneously measuring the amplitude modulation of the earth's magnetic field for various different repetition rates. Furthermore, since the longitudinal relaxation times $T_1$ are much longer for solids, only the paramagnetism of liquids in formation are observed (E. R. Andrew, op. cit., p. 151).

The total fluid volume, average fluid density, and the dimensions of the petroleum reservoir may be found from the following procedure. The variation in the earth's magnetic field during resonance $\delta B(Z)$ is measured for various distances Z above the oil field. Please refer to FIG. 6 which shows a typical plot of $\delta B(Z)$ vs. Z. Near the excitation zone of the oil formation, measurement of $\delta B(Z=0)$ yields the quantity $\rho$ in Eq. 9 which is the average number of unpaired protons/$M^3$ in the formation. Since the signal is primarily from liquids, this immediately yields the average fluid density within the formation. In region A in FIG. 6 which is near the excitation zone of the oil reservoir, the magnetic field decreases as $1/Z^2$ (R. Benumof, *Concepts in Electricity and Magnetism*, Holt, Rinehart and Winston, N.Y., p. 196, 1961). An inflection at point B in FIG. 6 demonstrates that the distance Z has reached some characteristic dimension of the oil field such as the thickness or the average diameter of the oil deposit. Region C shows the behavior of the magnetic field for large Z when the paramagnetic reservoir behaves as if it is a large single magnetic moment $U_T$. $U_T$ is of course the sum of all the magnetic moments in the excitation zone of the formation. Equation 10 shows that $\delta B(Z)$ decreases as $1/Z^3$ for large Z. (D. Halliday and R. Resnick, *Physics For Students of Science and Engineering*, John Wiley & Sons, N.Y., P. 772, 1963.

$$\delta B(Z) = (u_o U_T)/(4\pi Z^3) \qquad \text{Equation 10.}$$

Once $U_T$ is obtained by fitting the data, the total number of unpaired protons in the formation may be obtained. From the known chemical composition, nuclear properties and densities of crude oil, the free fluid volume of the excitation zone of the formation may be calculated.

There are a very large number of other embodiments of the invention. Any means may be used to cause the oil bearing formation to pass through the condition of nuclear magnetic resonance. Consequently, any means may be used to apply an A.C. magnetic field to the oil bearing formation near the Larmor frequency. Different methods of applying this A.C. magnetic field to the oil strata include but are not limited to the following: (1) passing A.C. current through the formation from one borehole to one or more surface electrodes; (2) passing A.C. current between two or more boreholes; (3) passing A.C. current through the earth between two or more electrodes placed on the earth's surface; (4) using one or more A.C. current carrying circular loops on the surface of the earth; (5) using one or more rectangular shaped A.C. current carrying coils on the surface of the earth; (6) inducing an A.C. magnetic field in the pipe surrounding a borehole with A.C. current carrying coils on the surface of the earth; (7) inducing an A.C. magnetic field in the pipe sorrounding a borehole using an A.C. current carrying coil inside the borehole; (8) using any borehole tool which generates an A.C. magnetic field by any means, (9) passing A.C. current from the pipe sorrounding a borehole into the earth; etc. Many of these surface methods would require large A.C. power sources since the statistical median resistivity of the surface overburden is 143 ohm-meters in the United States which results in an electromagnetic skin depth of only 134 meters at 2.1 khz (G. V. Keller and F. C. Frischknecht, op. cit., p. 40). Furthermore, all varieties of pulse methods may be used provided the methods produce the condition of resonance in the oil bearing formation.

Furthermore, any means with sufficient sensitivity may be used to measure the variation of the earth's magnetic field as the oil formation is swept through resonance. There are numerous types of magnetometers currently in use (W. M. Telford, *Applied Geophysics*, Cambridge University Press, Cambridge, p. 123, 1976). The sensitivity of these instruments may be substantially increased by using them in conjunction with high permeability magnetic materials. Differential magnetometers or magnetic field gradiometers as are widely used in the geophysical industry may also be used. Superconducting quantum interference devices may also be used as sensitive magnetometers (J. E. Zimmerman and W. H. Campbell, Geophysics, 40, No. 2, p. 269, 1975). A very large area induction coil on the surface of the earth with many turns and a diameter of one mile also has the required sensitivity.

And finally, the invention explicitly exploits the properties of nuclear magnetic moments such as unpaired protons. However, it is obvious that the method and apparatus can be applied to other nuclear, electronic, atomic or molecular properties of petroleum which have similar gyromagnetic features.

While the above description contains many specificities, these should not be construed as limitations on the scope of the invention, but rather as an exemplification of one preferred embodiment thereof. As has been briefly described, there are many possible variations. Accordingly, the scope of the invention should be determined not only by the embodiment illustrated, but by the appended claims and their legal equivalents.

I claim:

1. The apparatus for remote detection and volumetric measurement of a petroleum reservoir which comprises:
  a means for applying an A.C. magnetic field at the Larmor frequency to a significant portion of the oil bearing formation thereby placing said formation into a condition of nuclear magnetic resonance and thereby causing a variation in the paramagnetism of said formation; and
  a means which measures the variation in the magnetic field of the earth above said oil bearing formation which is caused by said variation in the paramagnetism of the oil bearing formation;
  whereby the petroleum reservoir contains constituents with nuclear magnetic moments; and
  whereby the petroleum reservoir is acted upon by the earth's magnetic field; and
  whereby the earth's magnetic field causes said nuclear magnetic moments to align along the direction of the earth's magnetic field; and
  whereby this said alignment causes the said paramagnetism of the oil bearing formation; and
  whereby the direction of the said A.C. magnetic field is at an angle to the direction of the earth's magnetic field; and
  whereby, depending on the longitudinal and transverse relaxation times of the fluids in the oil bearing formation, the strength and frequency sweep rate of the A.C. magnetic field are appropriate to place a significant portion of the oil bearing formation into a condition such as saturation whereby the paramagnetism of the formation is affected during resonance.

2. The apparatus as defined in claim 1 wherein said means for applying an A.C. magnetic field at the Larmor frequency to a significant portion of the oil bearing formation is a means for introducing A.C. current into said oil bearing formation.

3. The apparatus as defined in claim 2 wherein the means for introducing A.C. current into said oil bearing formation is a means of passing a variable strength A.C. current through the formation between two boreholes.

4. The apparatus as defined in claim 3 wherein the means for passing A.C. current between two boreholes also has a means to frequency sweep the A.C. current through the Larmor frequency at various different sweep rates which are shorter than the longitudinal relaxation time $T_1$ of the fluid in formation.

5. The apparatus as defined in claim 1 wherein the means which measures the variation in the magnetic field of the earth above said oil bearing formation is a sensitive induction magnetometer which is located above the oil bearing formation inside a borehole.

6. The method for remote detection and volumetric measurement of a petroleum reservoir which comprises the steps of:
  applying an A.C. magnetic field at the Larmor frequency to a significant portion of the oil bearing formation thereby placing said formation into a condition of nuclear magnetic resonance and thereby causing a variation in the paramagnetism of said formation; and
  measuring the variation in the magnetic field of the earth above said oil bearing formation which is caused by said variation in the paramagnetism of the oil bearing formation;
  whereby the petroleum reservoir contains constituents with nuclear magnetic moments; and
  whereby the petroleum reservoir is acted upon by the earth's magnetic field; and
  whereby the earth's magnetic field causes said nuclear magnetic moments to align along the direction of the earth's magnetic field; and
  whereby this said alignment causes the said paramagnetism of the oil bearing formation; and
  whereby the direction of said A.C. magnetic field is at an angle to the direction of the earth's magnetic field; and
  whereby, depending on the longitudinal and transverse relaxation times of the fluids in the oil bearing formation, the strength and frequency sweep rate of the A.C. magnetic field are appropriate to place a significant portion of the oil bearing formation into a condition such as saturation whereby the paramagnetism of the formation is affected during resonance.

7. The apparatus for remote detection and volumetric measurement of at least a portion of a petroleum reservoir in a formation which comprises:
  (a) means for applying an A.C. magnetic field to a portion of the formation at a frequency substantially equal to the Larmor frequency of the nucleons within the formation thereby placing a significant portion of any petroleum reservoir in the formation into a state of nuclear magnetic resonance which therefore causes a change in the paramagnetism of the formation thereby resulting in a change in the earth's magnetic field in the vicinity of said portion of the petroleum reservoir, and (b) means for simultaneously measuring the resulting change in the earth's magnetic field in the vicinity of said portion of the formation to provide an indication of the presence of petroleum in the formation and the quantity of oil present.

8. The method for remote detection and volumetric measurement of a petroleum reservoir in a formation which comprises the steps of applying an A.C. magnetic field to a portion of the formation at a frequency substantially equal to the Larmor frequency of the nucleons within formation thereby placing a significant portion of any petroleum reservoir in the formation into a state of nuclear magnetic resonance which therefore causes a change in the paramagnetism of the formation thereby resulting in a change in the earth's magnetic field in the vicinity of said portion of the petroleum reservoir and simultaneously measuring the resulting change in the earth's magnetic field in the vicinity of said portion of the formation to provide an indication of the presence of a petroleum reservoir in the formation and the quantity of oil present.

9. The apparatus of the remote detection and volumetric measurement of at least a portion of a petroleum reservoir which comprises a means of sweeping a portion of a petroleum reservoir through a state of nuclear magnetic resonance in a duration of time which is less than the longitudinal relaxation times of fluids in formation thereby substantially disturbing the paramagnetism of that portion of the reservoir placed into the condition of nuclear magnetic resonance thereby causing a change in the earth's magnetic field in the vicinity of said portion of the reservoir and simultaneously measuring the resulting change in the earth's magnetic field in the vicinity of said portion of the petroleum reservoir to indicate the presence or absence of petroleum in formation and the quantity of oil present.

10. The method for the remote detection and volumetric measurement of at least a portion of a petroleum reservoir which comprises the steps of sweeping a portion of a petroleum reservoir through a state of nuclear magnetic resonance in a duration of time which is less than the longitudinal relaxation times of the fluids in formation thereby substantially disturbing the paramagnetism of that portion of the reservoir placed into the condition of nuclear magnetic resonance thereby causing a change in the earth's magnetic field in the vicinity of said portion of the reservoir and simultaneously measuring the resulting change in the earth's magnetic field in the vicinity of said portion of the petroleum reservoir to indicate the presence or absence of petroleum and the quantity of oil present.

11. The apparatus for remote detection and volumetric measurement of a petroleum reservoir in a formation which comprises a means for placing a significant portion of a petroleum reservoir in the formation into a state of saturation and a means for simultaneously measuring the resulting variation in the earth's magnetic field in the vicinity of the formation.

12. The method as in claim 6 wherein the A.C. magnetic field is repetitively swept through the Larmor frequency of the nucleons within a significant portion of the oil bearing formation thereby placing said portion of the oil bearing formation repetitively into a condition of nuclear magnetic resonance thereby causing a repetitive variation in the nuclear paramagnetism within said portion of the oil bearing formation and thereby causing an amplitude modulation in the nuclear paramagnetism of said portion of the oil bearing formation thereby causing an amplitude modulation in the magnetic field of the earth in the vicinity of said portion of the oil bearing formation; and simultaneously measuring the amplitude modulation of the magnetic field of the earth in the vicinity of said portion of the formation to indicate the presence or absence of oil and water in formation.

13. The method as in claim 12 wherein the amplitude modulation of the earth's magnetic field is measured to give a measurement of the volume of oil and water combined within the significant portion of the oil bearing formation which is repeatedly placed into a condition of nuclear magnetic resonance.

14. The method as in claim 13 wherein the range of the relaxation times of the fluid constitutents and the relative volumes of oil and water in formation may be determined by suitably varying the repetition rate at which the portion of the oil bearing formation is repetitively placed into the condition of nuclear magnetic resonance and where said repetition rate is adjusted by changing the period of the periodically sweeping A.C. magnetic field while simultaneously measuring the magnitude of the amplitude modulation of the earth's magnetic field within the vicinity of said portion of the oil bearing formation.

15. The method as in claim 14 wherein the period of the repetition rate is initially chosen to be longer than the longitudinal relaxation time of the oil in formation and is thereafter set to progressively shorter intervals of time whereby the period of the repetition rate is ultimately adjusted to be shorter than the longitudinal relaxation time of the oil in formation while simultaneously measuring the amplitude modulation of the earth's magnetic field in the vicinity of the significant portion of the oil bearing formation which is repetitively placed into a condition of nuclear magnetic resonance thereby allowing the measurement of the volume of oil within said portion of the oil bearing formation.

16. The method as in claim 14 wherein the period of the repetition rate is initially chosen to be longer than the longitudinal relaxation time of any constitutent fluid of interest within the portion of the formation which is repetitively placed into the condition of the nuclear magnetic resonance and where said period is thereafter set to progressively shorter intervals of time than the longitudinal relaxation time of the particular fluid constituent of interest in said portion of the formation while simultaneously measuring the amplitude modulation of the earth's magnetic field in the vicinity of said portion of the formation whereby the formation contains a variety of constituent fluids collectively called oil and water with ranges of relaxation times appropriate for said constitutents in formation.

17. A method of detecting the presence of petroleum reserves in a formation which comprises the steps of:
(a) applying an A.C. magnetic field at frequencies near and including the Larmor frequency of the nucleons in any oil present which is at an angle with respect to the earth's magnetic field to bring a portion of the reserves into nuclear magnetic resonance to reduce the nuclear paramagnetism of said portion of the petroleum reserve, and (b) simultaneously detecting any change in the total magnetic field of the earth in the vicinity of said portion of the reserve to sense a change in the nuclear paramagnetism of said portion of the reserve whereby to indicate the presence or absence of petroleum reserves.

18. A method as in claim 17 wherein the magnitude of the change in the magnetic field is measured to give an indication of the volume of petroleum present.

19. A method as in claim 17 wherein the frequency of the magnetic field is swept from a frequency below the Larmor frequency to a frequency above the Larmor frequency at a rate such that the nucleons within said portion of the petroleum reserve are driven into nuclear magnetic resonance.

20. The method as in claim 19 wherein the sweep rate is such that nuclear magnetic resonance is achieved in a time shorter than the longitudinal relaxation time of any fluid constitutent of interest within said portion of the formation.

21. The method as in claim 17 wherein the frequency is periodically swept through the Larmor frequency of the nucleons within said portion of the formation.

22. The method as in claim 21 wherein the period between sweeps is selected to permit only the nucleons in water within said portion of the formation to realign between sweeps.

23. The method as in claim 21 wherein the period between sweeps allows the nucleons in both oil and water in said portion of the formation to realign between sweeps.

24. Apparatus for the remote detection of unknown petroleum reservoirs and volumetric measurement of petroleum reserves in a formation comprising means for generating and applying an A.C. magnetic field to a portion of the formation at frequencies near and including the Larmor frequency of the nucleons within any petroleum present at an angle with respect to the earth's magnetic field, means for measuring the total magnetic field in the vicinity of said portion of the formation, and means for indicating a change in the earth's magnetic field in the vicinity of said portion of the formation whereby to indicate the change in the nuclear paramagnetism of said portion of the formation to indicate the presence and volume of the fluid contained within said portion of the formation.

25. Apparatus for remote detection of unknown petroleum reservoirs and volumetric measurement of petroleum reserves which comprises a means for placing a significant portion of the petroleum reservoir into a state of nuclear magnetic resonance to reduce its nuclear paramagnetism and means for measuring the resultant change in the earth's magnetic field adjacent to said portion of the formation caused by the reduction of the nuclear paramagnetism of said portion of the formation which is caused by the state of nuclear magnetic resonance within said portion of the formation to thereby indicate the presence and volume of petroleum contained within said portion of the formation.

26. Apparatus for the remote detection of unknown petroleum reservoirs and the volumetric measurement of a petroleum reservoir which comprises a means of sweeping a portion of the petroleum reservoir through a state of nuclear magnetic resonance in a time less than the longitudinal relaxation times of the fluids in said portion of the reservoir thereby substantially disrupting the nuclear paramagnetism of said portion of the reservoir and a means for measuring the resulting change in the magnetic field of the earth in the vicinity of said portion of the reservoir to measure the change in the nuclear paramagnetism of said portion of the oil bearing formation thereby indicating the presence or absence of petroleum and the volume of oil present.

27. Apparatus for measurement of oil reserves in a geological formation including:
(a) means for passing an A.C. current through the formation to generate an A.C. magnetic field in a predetermined portion of the formation; and
(b) means for sweeping the frequency of the A.C. current so that the frequency sweeps from a frequency below the Larmor frequency to above the Larmor frequency of the nucleons chemically bound to the oil present in said portion of the oil bearing formation to bring the nucleons into resonance and cause a reduction in the paramagnetism of said portion of the formation; and
(c) means for measuring the magnetic field in a borehole adjacent to said portion of the formation said means serving to measure changes in the earth's magnetic field to indicate a change in the paramagnetism of said portion of the formation.

28. Apparatus as in claim 27 wherein said current is periodically swept through said Larmor frequency of the nucleons in formation.

29. Apparatus as in claim 27 wherein said current is periodically swept through the Larmor frequency at intervals of time which are less than the longitudinal relaxation time of the oil nucleons in formation.

30. Apparatus as in claim 27 wherein said means for measuring the magnetic field is a differential magnetometer.

31. The method of determining the relative amounts of oil and water contained in an oil reservoir in a geological formation which comprises the steps of:
(a) applying a periodically sweeping magnetic field to a portion of the formation which sweeps from a frequency below the Larmor frequency to a frequency above the Larmor frequency repetitively at periods which are less than the longitudinal relaxation time of the nucleons within any oil present and simultaneously measuring the amplitude modulation of the earth's magnetic field in the vicinity of said portion of the formation where said Larmor frequency is appropriate for nucleons within the formation; and
(b) then applying a periodically sweeping magnetic field to said portion of the formation which sweeps from below the Larmor frequency to a frequency above the Larmor frequency repetitively at periods which are greater than the longitudinal relaxation time of the nucleons within any oil present and simultaneously measuring the amplitude modulation of the earth's magnetic field in the vicinity of said portion of the formation; and
(c) whereby the difference in the said measurements performed for different repetition rates are used to infer the relative amounts of oil and water present within said portion of the oil bearing formation.

* * * * *